(12) United States Patent
Chu

(10) Patent No.: US 9,196,316 B2
(45) Date of Patent: *Nov. 24, 2015

(54) SELF-DISABLING CHIP ENABLE INPUT

(75) Inventor: Daniel Chu, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/995,172

(22) PCT Filed: Sep. 1, 2011

(86) PCT No.: PCT/US2011/050265
§ 371 (c)(1),
(2), (4) Date: Jun. 17, 2013

(87) PCT Pub. No.: WO2013/006187
PCT Pub. Date: Jan. 10, 2013

(65) Prior Publication Data
US 2013/0272048 A1    Oct. 17, 2013

Related U.S. Application Data

(60) Provisional application No. 61/504,493, filed on Jul. 5, 2011.

(51) Int. Cl.
*G11C 5/06* (2006.01)
*H03K 19/00* (2006.01)
(Continued)

(52) U.S. Cl.
CPC *G11C 5/06* (2013.01); *G11C 7/109* (2013.01); *G11C 7/20* (2013.01); *H03K 19/00* (2013.01); *H01L 2224/32145* (2013.01); *H01L 2224/32245* (2013.01); *H01L 2224/48247* (2013.01); *H01L 2224/73265* (2013.01); *H01L 2225/06562* (2013.01)

(58) Field of Classification Search
None
See application file for complete search history.

(56) References Cited

U.S. PATENT DOCUMENTS 7,518,409 B2 *   4/2009   Lee et al. .................... 326/101
7,688,628 B2 *   3/2010   Grimsrud ................. 365/185.11
(Continued)

FOREIGN PATENT DOCUMENTS

KR   1020090026914 A    3/2009
KR   1020100133613 A   12/2010
(Continued)

OTHER PUBLICATIONS

Hynix Semiconductor et al.,"Open NAND Flash Interface Specification", Revision 3.0, Mar. 9, 2011, 288 pages.
(Continued)

*Primary Examiner* — James G Norman
(74) *Attorney, Agent, or Firm* — Alpine Technology Law Group LLC

(57) ABSTRACT

A multi-die memory package may have separate chip enable inputs for the respective memory dice. Individual chip enable inputs may be separated by other chip connections such as power and ground. The memory dice may include multiple chip enable inputs to allow easy wire bonding of the individual chip enable inputs to a die without requiring any jumpers within the package. Circuitry may be included so that undriven chip enable inputs are masked and driven chip enable inputs may be propagated to the memory die to enable memory accesses while a single chip enable input is only connected to the capacitance of a single bonding pad.

6 Claims, 8 Drawing Sheets

(51) Int. Cl.
*G11C 7/10* (2006.01)
*G11C 7/20* (2006.01)

(56) References Cited

U.S. PATENT DOCUMENTS

| | | | | |
|---|---|---|---|---|
| 7,944,036 | B2* | 5/2011 | Sasaki | 257/686 |
| 8,255,650 | B1* | 8/2012 | Gruttadauria et al. | 711/162 |
| 8,630,107 | B2 | 1/2014 | Chu | |
| 2005/0253236 | A1* | 11/2005 | Nakayama | 257/678 |
| 2007/0047284 | A1 | 3/2007 | Silvestri | |
| 2009/0168518 | A1 | 7/2009 | Seong | |
| 2009/0224822 | A1* | 9/2009 | Alzheimer et al. | 327/534 |
| 2012/0155173 | A1* | 6/2012 | Lee et al. | 365/185.09 |
| 2013/0010517 | A1 | 1/2013 | Chu | |

FOREIGN PATENT DOCUMENTS

WO 2013/006187 A1 1/2013
WO 2013006187 A1 1/2013

OTHER PUBLICATIONS

International Search report and Written Opinion Received for PCT Patent Application No. PCT/US2011/050265, mailed on May 29, 2012, 9 pages.
International Preliminary Report on Patentability received for Patent Application No. PCT/US2001/050265, mailed on Jan. 16, 2014.
Issue Notification received for U.S. Appl. No. 13/570,782, mailed on Dec. 24, 2013.
Office Action received for Japanese Patent Application 2014-518534, mailed on Jan. 27, 2015, 5 pages including 2 pages of English Translation.
Office Action received for Korean Patent Application 10-2014-7001296, mailed on Feb. 2, 2015.
Notice of Allowance received for Korean Patent Application 10-2014-7001296, mailed on Aug. 25, 2015, 5 pages.

* cited by examiner

SELF-DISABLING CHIP ENABLE INPUT

CROSS-REFERENCE TO RELATED APPLICATIONS

This application claims the benefit of U.S. Provisional Patent Application Ser. No. 61/504,493 entitled "AUTOMATIC SELF-DISABLING INPUT BUFFER" and filed on Jul. 5, 2011, the entire contents of which is hereby incorporated by reference.

TECHNICAL FIELD

The present subject matter relates generally to the field of electronics, including electronic memory devices. More specifically, the present subject matter relates to chip enable inputs of electronic memory die for a multi-die memory package.

BACKGROUND

Memory for computers or other electronic devices can include blocks of memory cells integrated into a larger integrated circuit or stand-alone integrated circuits. There are many different types of memory including random-access memory (RAM), read only memory (ROM), dynamic random access memory (DRAM), static RAM (SRAM), synchronous dynamic RAM (SDRAM), flash memory and phase change memory (PCM).

As demand for greater capacities of memory grows, some memory devices may include multiple electronic memory dice in one package. In some instances, such as designs compliant with specifications from the Open NAND Flash Interface (ONFI) Workgroup, the device may include multiple chip enable inputs in one package that may provide for a separate chip enable input for each memory die. Some packages, such as ball-grid array (BGA) and land-grid array (LGA) packages may have multi-layer wiring substrates to route the various chip enable inputs to a particular memory die, but other packages, such as the Very Very Thin Small Outline Package (WSOP) and the Thin Small Outline Package (TSOP) may have a single layer lead-frame that limits the routing that can be done in the package itself.

Some devices may include a jumper wire in the package from a particular chip enable input lead to a separate lead bonding area. A bond wire may then be used to connect the separate lead bonding area to a memory die's chip enable pad. Such in-package jumpers may increase assembly complexity, time, and/or cost, decrease manufacturing yields, and may decrease the amount of space in the package available for the memory dice.

BRIEF DESCRIPTION OF THE DRAWINGS

The accompanying drawings, which are incorporated in and constitute part of the specification, illustrate various embodiments of the claimed subject matter. Together with the general description, the drawings serve to explain the principles of the claimed subject matter. They should not, however, be taken to limit the claimed subject matter to the specific embodiments described, but are for explanation and understanding of the claimed subject matter. Such subject matter may be understood by reference to the following detailed description when read with the accompanying drawings in which:

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures and components have been described at a relatively high-level, without detail, in order to avoid unnecessarily obscuring aspects of the present concepts. A number of descriptive terms and phrases are used in describing the various embodiments of the claimed subject matter. These descriptive terms and phrases are used to convey a generally agreed upon meaning to those skilled in the art unless a different definition is given in this specification. Reference now is made in detail to the examples illustrated in the accompanying drawings and discussed below.

Figure 1A:
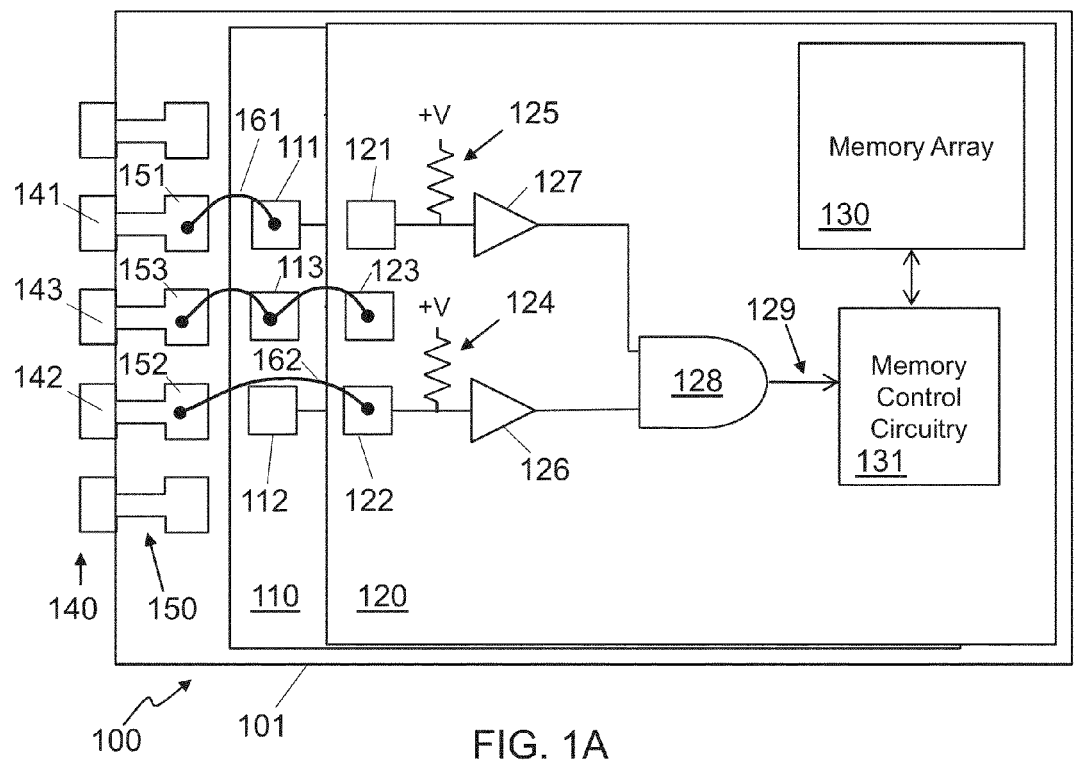
FIG. 1A is a diagram of an embodiment of a memory device using two electronic memory dice that include self-disabling chip enable inputs.

FIG. 1A is a diagram of an embodiment of an electronic memory device 100 with two electronic memories, electronic memory die 110 and electronic memory die 120, that include self-disabling chip enable inputs. The memory device 100 includes a package 101 with external connections 140. The external connections 140 may include through-hole pins, J-leads, gull-wing leads, solder balls, land patterns, or other electrical connections, and may be referred to as "pins" in this disclosure and the included claims. The device 100 may incorporate a wiring apparatus 150 such as a single-layer or multi-layer printed circuit board, a single layer lead-frame, or other electrical connection between the pins of the device and die connection points that may be used to connect to the memory dice. A variety of external pins 140 may be included such as chip enable pins CEN1 141, CEN2 142, and other pin 143 that may be physically located between CEN1 141 and CEN2 142. The wiring apparatus 150 may connect CEN1 141 to the CEN1 die connection 151, CEN2 142 to CEN2 die connection 152, and the other pin 143 to other die connection 153. The other die connection 153 may be located between CEN1 die connection 151 and CEN2 die connection 152. This may be due to a single layer wiring apparatus 150 that does not allow the wires from pin to die connection to cross.

The package 100 may be designed to accommodate multiple memory dice, such as memory die one 110 and memory die two 120. Other embodiments may accommodate a single memory die and others more than two memory dice, including some embodiments that may accommodate 4 dice and other embodiments that may accommodate 8 dice, although other embodiments may accommodate any number of dice. Memory die one 110 may include CEN1 (chip enable) input pad 111 and CEN2 input pad 112 with other input pad 113 located between CEN1 111 and CEN2 112. Memory die two 120 may have its own CEN1 input pad 121 and CEN2 input pad 122 with other input pad 123 located between CEN1 121 and CEN2 122. The other die connection 153 may be connected to the other pad 113 of memory chip one 110 and the other pad 123 of memory chip two 120 using daisy-chained bonding wires as shown. The CEN1 die connection 151 may be connected to the CEN1 input pad 111 of memory die one 110 using bonding wire 161 and the CEN2 die connection 152 may be connected to the CEN2 input pad 122 or memory die two 120 using bonding wire 162. The arrangement shown avoids any crossing of bonding wires that might result in bonding wires touching, causing an improper operation of the memory device 100.

Memory die two 120 may include additional circuitry including a memory array 130 that may be a flash memory array or may utilize some other type of electronic storage element. Memory control circuitry 131 may also be included to control the operation of the memory array 130. An internal chip enable line 129 may be used to enable the memory control circuitry 131 and allow the memory array 130 to be accessed. The internal chip enable line 129 may be based on the voltage levels asserted on the CEN1 input pad 121 or CEN2 input pad 122 so that a connected CEN input pad value is propagated through to the internal chip enable line 129 and an unconnected CEN input pad is masked to avoid any spurious reactions to noise or other unintended voltage levels.

In the embodiment shown in FIG. 1A, CEN1 121 and CEN1 122 may be active low inputs with respective pull-ups 125 and 124. The pull-ups 124, 125 may be sized large enough so that an external driver can still drive the input to a low value, but small enough to ensure that the input is held high even in the presence of noise, such as a pull-up of about 700 kilo-ohms (kΩ), although other embodiments may use larger or smaller pull-up values. Other embodiments may use a field effect transistor (FET) or other active device in place of a resistive pull-up. Input buffer 127 may buffer the CEN1 input pad 121 and input buffer 126 may buffer the CEN2 input pad 122. The output of the two input buffers 126, 127 may then be fed into AND gate 128 to generate the internal chip enable line, IntCEN 129. By connecting the individual input pads to separate input buffers, the capacitance of CEN1 121 and CEN2 122 may be isolated from each other. This may be referred to as isolating the two input pads so that they are not directly electrically connected and that the capacitance that may be measured at one input pad is not impacted by the capacitance of the other input pad. Isolated input pads may still feed into a common logic circuit so that the both inputs may logically interact. While some other embodiments may simply electrically connect the two input pads and use a single buffer to drive the internal chip enable line, such a circuit would result in a larger input capacitance for the CEN2 input pin 142 of the memory device 100.

Additional details of circuitry on memory die one 110 is not shown but in many embodiments, memory die one 110 may have similar or identical circuitry to that shown for memory die two 120 as described above. Although FIG. 1A shows one example circuit capable of implementing self-disabling chip enable inputs in accordance with one or more embodiments, it should be noted that other various other circuits may be realized that are capable of implementing self-disabling chip enable inputs, and the scope of the claimed subject matter is not limited in this respect.

Figure 1B:
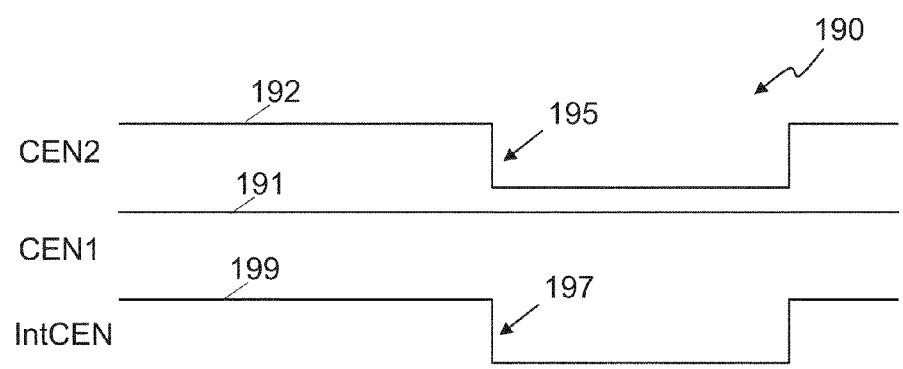
FIG. 1B is a timing diagram of selected waveforms of FIG. 1A.

FIG. 1B is a timing diagram 190 of selected waveforms of FIG. 1A. The CEN1 waveform 191 and the CEN2 waveform 192 may be the voltage levels at the CEN1 input pad 121 and CEN2 input pad 122 of memory die two 120, respectively. The IntCEN waveform 199 may be the internal chip enable line 129 of memory die two 120, as driven by AND gate 128. CEN1 is held high by pull-up 125 and CEN2 is driven by an external source so both CEN1 and CEN2 are inactive high until CEN2 goes low at 195. Because CEN1 is high, the CEN2 waveform 192 propagates through the AND gate 128, driving the IntCEN waveform 199 low at 197 and enabling memory die two 120 for access.

Figure 2A:
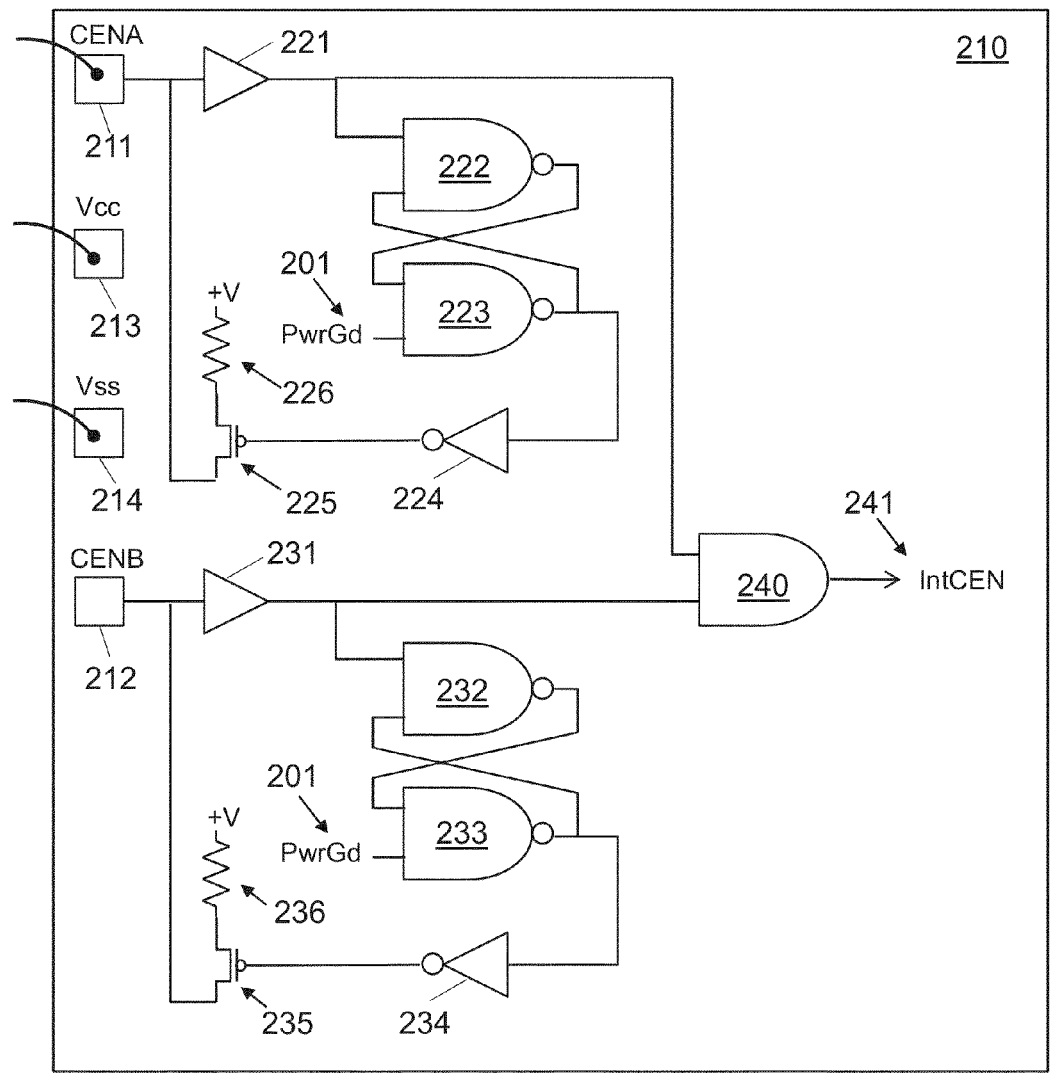
FIG. 2A is a schematic of circuitry for an alternative embodiment of self-disabling chip enable inputs.

FIG. 2A is a schematic of circuitry for an alternative embodiment of self-disabling chip enable inputs. Circuitry for a single memory die 210 is shown. The memory die 210 may be useful for a memory device supporting multiple memory dice such as that shown in FIG. 4A. The chip enable CENA 211 and CENB 212 input pads may be self-disabling. If CENA 211 or CENB 212 are left floating with no external driver connection, they will be pulled up to an inactive state.

The memory die 210 may have CENA input pad 211 connected to input buffer 221 and CENB 212 connected to input buffer 231. CENA input pad 211 may be connected to an external driver by a bonding wire as shown or may be unconnected and CENB input pad 212 that may be unconnected as shown or may be connected to an external driver. Other inputs, such as Vcc input pad 213 and Vss input pad 214 and/or other input pads, may be positioned on the memory die 210 between CENA 211 and CENB 212 to match industry specifications or for other reasons.

The memory die 210 may generate an indication that the memory die is ready for operation such as a Power Good (PwrGd) line 201 indicating that input voltages are valid, input buffers are operational, or some other indication that the memory die is ready for operation such as internal configuration being completed. Two $\overline{S}$-$\overline{R}$ flip-flops implemented by cross-coupled NAND gates 222, 223 and 232, 233 may be cleared if PwrGd 201 is low, indicating that the memory device 210 is not yet ready for operation. Any type of memory element may be used in place of the $\overline{S}$-$\overline{R}$ flip-flops, including, but not limited to D flip-flops, D latches, J-K flip-flops. J-K latches, registers, memory cells, or charge storage devices, and my be referred to as a 'latch' in this disclosure and associated claims. And although the examples may use specific logic states of a latch to represent cleared and set states of the latch, it should be clear to one of ordinary skill in the art that this is merely a convention of convenience and either logic state may be used as the cleared state, with the inverse logic state used for the set state, depending on the embodiment.

The output of NAND gate 223, which may be thought of as the output that is the inverse of the state of the latch, may drive an inverter 224 and the output of the inverter 224 may be connected to the gate of p-channel FET (p-FET) 225. The source of p-FET 225 may be connected to pull-up 226 and the drain of p-FET 225 may be connected to the CENA input pad 211. As long as the output of NAND gate 223 is high, indicating that the latch is clear, the pull-up 226 is connected to the CENA input pad 211. A similar arrangement for the CENB input pad 212 uses inverter 234, p-FET 235 and pull-up 236.

By using the p-FET 225 to disconnect the pull-up 226 once CENA 211 has transitioned to active, less direct current (DC) power may be used by the pull-up 226, as compared to the circuit of FIG. 1A that dissipates DC power in the pull-up if the CEN input is active. Turning the pull-up 226 off once the CENA input pad 211 goes active also reduces the possibility of the additional current impacting the switching parameters of the input buffer 221, such as the voltage input switching threshold or speed of the buffer 211. Pull-ups 226, 236 may have a value of about 50 kΩ although other embodiments may use larger or smaller pull-up values as the actual resistance value may not be critical. Other embodiments may use FETs or other active devices in place of the pull-up resistors.

The outputs of buffer 221 and buffer 231 may be connected to the inputs of AND gate 240 with the output of AND gate 240 being the internal chip enable line 241. The internal chip enable line 241 may be used to communicate with memory control circuitry on the memory die 210, allowing access to a memory array on the memory die 210. In some embodiments, the internal chip enable line 241 may be used to control a standby power state of the memory die 210 so that the memory die 210 is in a low power state if the internal chip enable line 241 is inactive high. Although FIG. 2A shows one example circuit capable of implementing self-disabling chip enable inputs in accordance with one or more embodiments, it should be noted that other various other circuits may be realized that are capable of implementing self-disabling chip enable inputs, and the scope of the claimed subject matter is not limited in this respect.

Figure 2B:
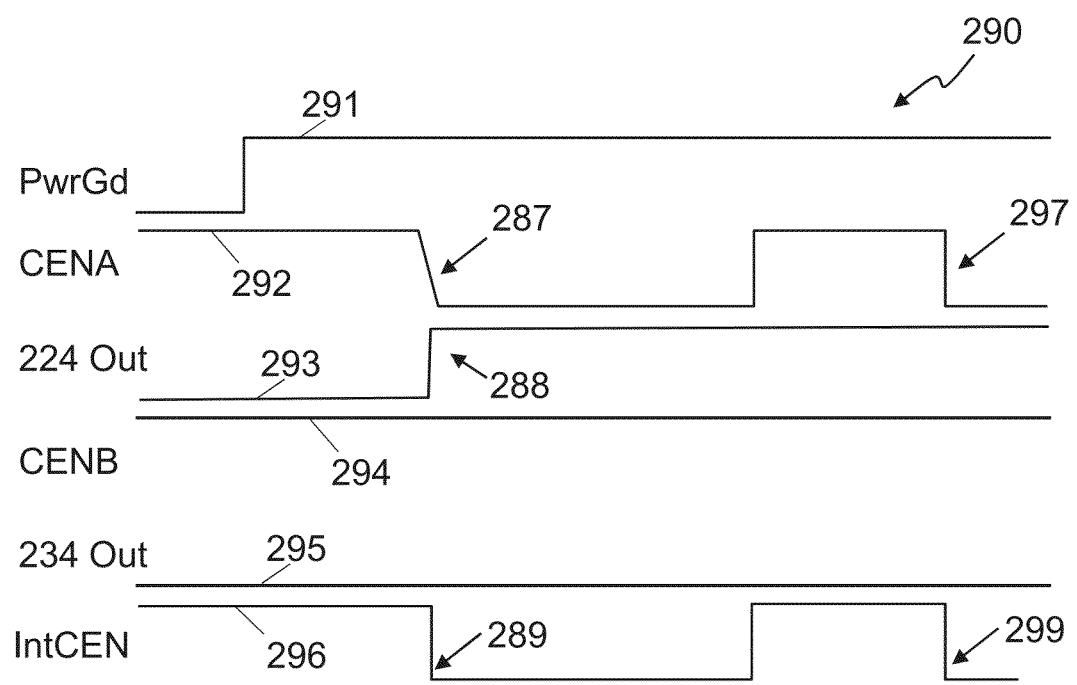
FIG. 2B is a timing diagram of selected waveforms of FIG. 2A.

FIG. 2B is a timing diagram 290 of selected waveforms of FIG. 2A. The PwrGd waveform 291 starts low indicating that the memory die 210 is not yet ready for operation. The low value of PwrGd clears the latches which flow through the inverters so that the output of inverter 224, waveform 293, is low and the output of inverter 234, waveform 295, is low. Since the CENB input pad 212 is unconnected, the low 234 OUT turns on p-FET 235, connecting the pull-up 236 to the CENB input pad 212, and driving the CENB waveform 294 to a high state. The CENA input pad 211, waveform 292, is also pulled high by p-FET 225 connecting pull-up 226, but may also be driven high by an external source during that time.

The external source connected to the CENA input pad 211 may drive waveform 292 active low at 287, overcoming the pull-up 226. The added current from the pull-up 226 may slow the fall-time of waveform 292. This sets the latch 222, 223 forcing 224 OUT, waveform 293, to go inactive high at 288, turning off the p-FET 225 to disconnect the pull-up 226. Disabling the pull-up may reduce the current that the external driver sinks to drive the CENA input pad 211 low, and may also reduce power as compared to the embodiment of FIG. 1A by eliminating a DC current path for the remainder of the active time of CENA and all subsequent times that the CENA input pad 211 is low. The AND gate 240 propagates the waveform 292 at 289 to enable the internal chip enable line 241 as shown by waveform 296. If the CENA input pad 211 is driven active again at a future time 297, the pull-up 226 is no longer connected, and the fall time of waveform 292 may be faster.

Figure 3A:
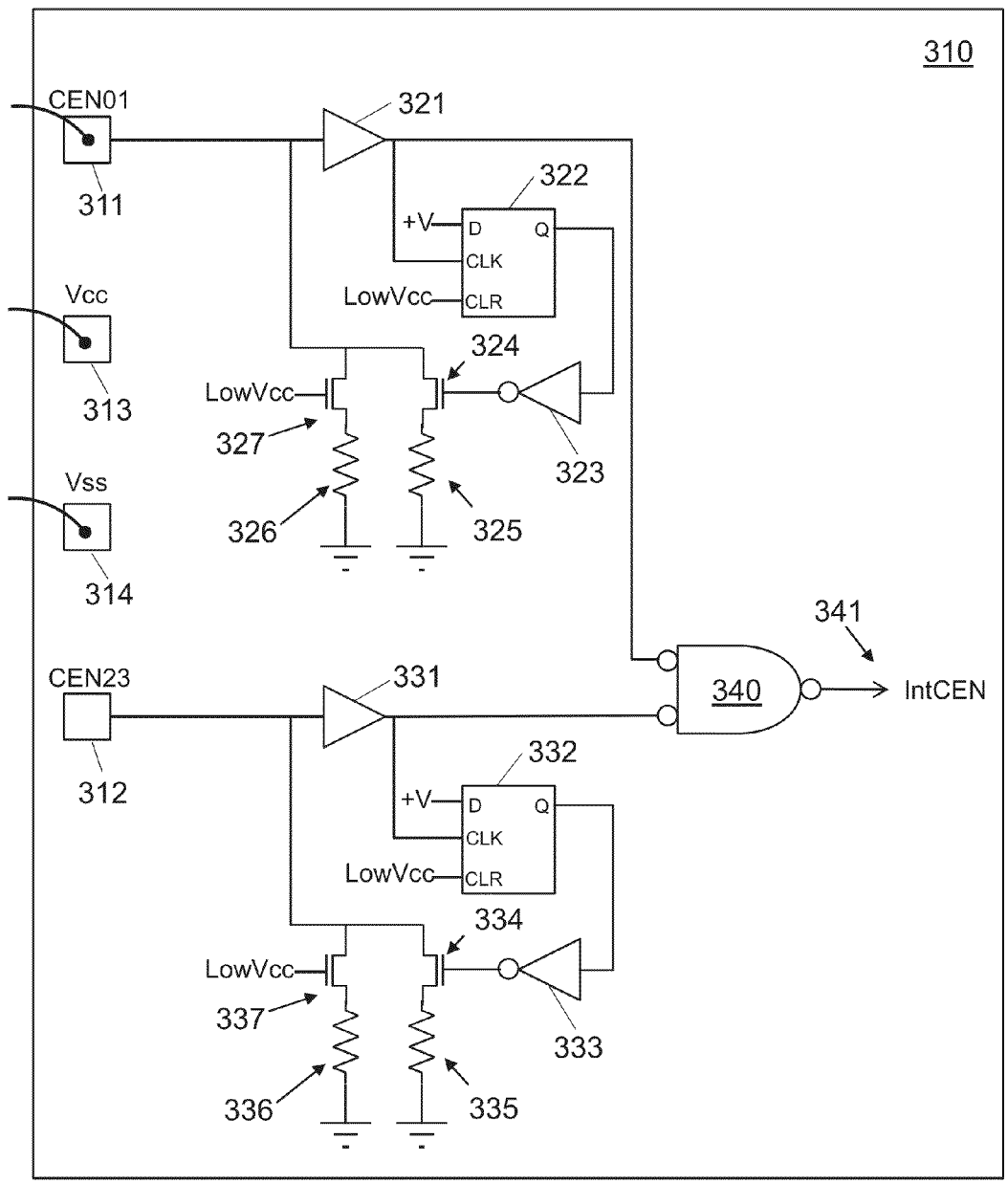
FIG. 3A is a schematic of circuitry for another embodiment of self-disabling chip enable inputs.

FIG. 3A is a schematic of circuitry for another embodiment of self-disabling chip enable inputs. Circuitry for a single memory die 310 is shown. The memory die 310 may be useful for a memory device supporting multiple memory dice such as that shown in FIG. 4A. The CEN01 311 and CEN23 312 input pads may be self-disabling. If either CEN01 311 or CEN23 312 is left floating with no external driver connection, it will be pulled down. The power-up sequence for many memory devices specifies that the chip enable inputs should be held high during the initial power ramp, so the self-disabling input pads 311, 312 may detect if they are left floating or not during that time. The operation of the self-disabling input of the embodiment shown in FIG. 3A may be simply described as:

(a) If the input never goes high, a weak pull-down holds it low.
(b) If the input goes high, the weak-pull-down is turned off.

The memory die 310 may have CEN01 input pad 311 connected to input buffer 321 and CEN23 312 connected to input buffer 331. CEN01 input pad 311 may be connected to an external driver by a bonding wire as shown or may be unconnected and CEN23 input pad 312 that may be unconnected as shown or may be connected to an external driver. Other inputs, such as Vcc input pad 313 and Vss input pad 314 and/or other pads, may be positioned on the memory die 310 between CEN01 311 and CEN23 312 to match industry specifications or for other reasons.

The memory die 310 may generate an indication that the memory die 310 is not ready for operation, such as a LowVcc line indicating that internal Vcc power is not high enough for input buffers to function reliably. Other embodiments may generate similar signals indicating that the memory die 310 is not ready for operation based on conditions such as: not all input voltages are valid or internal configuration not completed. Two level-sensitive latches 322, 332 may be cleared if LowVcc is active indicating that the memory device 310 is not yet ready for operation. Various embodiments may use any type of memory element for the latches 322, 332.

The output of latch 322 may drive an inverter 323 and the output of the inverter 323 may be connected to the gate of FET 324. The drain of FET 324 may be connected to pull-down 325 and the source of FET 324 may be connected to the CEN01 input pad 311. As long as latch 322 is clear, the pull-down 325 is connected to the CEN01 input pad 311. A similar arrangement for the CEN23 input pad 312 uses latch 332, inverter 333, FET 334 and pull-down 335. The weak pull-downs 325, 335 used to hold the input pads low after LowVcc is high may have a relatively high value to minimize the source current of an external driver to assert a high value. A value of about 100 kΩ may be suitable for pull-downs 325, 335 although other embodiments may use larger or smaller pull-up values as the actual resistance value may not be critical. Other embodiments may use FETs or other active devices in place of the pull-down resistors 325, 335 to create a weak pull-down that may be easily overdriven by an external source. A weak driver may refer to either a pull-down or active device that may be overridden by a typical driver to the inverse of the logic value that the weak driver is asserting.

In some embodiments an additional switched pull-down is included on the CEN01 input pad 311 and CEN23 input pad 312. The LowVcc line may be used to activate a FET 327 before the memory die 310 is ready for operation, connecting pull-down 326 to the CEN01 input pad 311. Similarly, the LowVcc line may be used to activate a FET 337 before the memory die 310 is ready for operation, connecting pull-down 336 to the CEN23 input pad 312. The additional pull-downs 326, 336 may be a lower resistance value than the other pull-downs 325, 335 to make the inputs less susceptible to noise during power-up of the memory die 310 when voltages may be lower and coupling to the ramping voltage inputs may occur. Although any value of resistance may be used, depending on the embodiment, in some embodiments a value of about 10 kΩ may be suitable for pull-downs 326, 336. Other embodiments may use FETs or other active devices in place of the pull-down resistors 326, 336 to create a strong pull-down that may be resistant to noise. The pull-down or active device used to more strongly hold the inputs low before the memory die is ready for operation may be referred to as an additional driver. The presence of the additional driver may increase the leakage current on the input pad during power-up.

By pulling the unconnected CEN23 input buffer 312 down, instead of pulling it up as in the circuits of FIGS. 1A and 2A, the unconnected input may be detected earlier, before the device is being used and timing parameters for inputs, such as CEN01 or CEN23, come into play. In many embodiments, the chip enable inputs may be driven high during the ramp-up of the power supplies. In such cases, the unconnected input can be detected as soon as the LowVcc line goes inactive, as the connected input will be high by that time and the unconnected input will be pulled low. By detecting the connected CEN01 input buffer 311 before any attempt to enable the memory die 310 and disconnecting the pull-downs 325, 326, the initial time that the CEN01 input buffer 311 is driven active has the same electrical characteristics as any subsequent access.

The outputs of buffer 321 and buffer 331 may be connected to the inputs of OR gate 340 with the output of OR gate 340 being the internal chip enable line 341 although some embodiments may route both buffer outputs to the memory control circuitry where internal logic may determine if the memory die 310 is enabled based on the driven input. The internal chip enable line 341 may be used to inform memory control circuitry on the memory die 310 to allow access to a memory array on the memory die 310. In some embodiments, the internal chip enable line 341 may be used to control a standby power state of the memory die 310 so that the memory die is in a low power state if the internal chip enable line 341 is inactive high. Some embodiments may have more than two chip enable inputs that may have the self-disabling circuitry as described herein. Such embodiments may have a final logic stage with inputs for the additional chip enable inputs, such as a 3 input OR gate if there are three chip enable inputs. Although FIG. 1A shows one example circuit capable of implementing self-disabling chip enable inputs in accordance with one or more embodiments, it should be noted that other various other circuits may be realized that are capable of implementing self-disabling chip enable inputs, and the scope of the claimed subject matter is not limited in this respect.

Figure 3B:
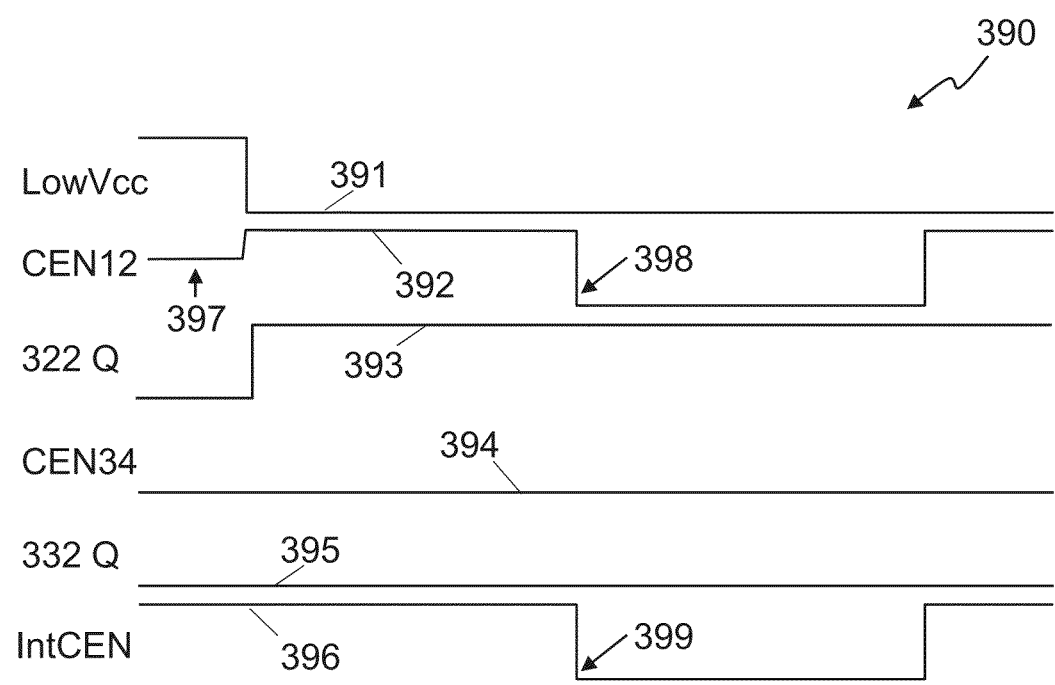
FIG. 3B is a timing diagram of selected waveforms of FIG. 3A.

FIG. 3B is a timing diagram 390 of selected waveforms of FIG. 3A. The LowVcc waveform 391 starts high indicating that the memory die 310 is not yet ready for operation. The high value of LowVcc clears the latches 322, 332 as shown by the latch 322 Q waveform 393 and latch 332 Q waveform 395. The 322 Q waveform 393 flows through inverter 323 to FET 324 to connect the weak pull-down 325 to CEN01 input pad 311. The 332 Q waveform 395 flows through inverter 333 to FET 334 to connect the weak pull-down 335 to CEN23 input pad 312. A high value of LowVcc also turns on FETs 327, 337 to connect the strong pull-downs 326, 336 to the CEN 12 input pad 311 and CEN23 input pad 312 respectively. CEN 34 input pad 312 is pulled low as there is no external driver connected to CEN23 input pad 312. An external driver that may be driving the CEN 12 input pad 311 high may not be able to source enough current to bring the CEN01 input pad 311 to a full high value due to the strong pull-down 326 as shown at 397 although in some embodiments, an external driver may be able to source the current to drive waveform 392 to a full high value.

Once LowVcc goes low, the FETs 327, 337 turn off disconnecting the strong pull-downs 326, 336 from the CEN 12 input pad 311 and CEN23 input pad 312 respectively and allowing the external driver to drive the CEN01 waveform 392 to a valid high value, as the weak pull-down 325 can be overridden. Once the LowVcc line is high and is no longer clearing the latches 322, 332, latch 332 stays clear as the CEN23 waveform 394 is low and does not clock a '1' into latch 332. The high level of the CEN01 waveform 392 driven by the external driver may dock a '1' into latch 322, which flows through inverter 323 to FET 324, turning it off and disconnecting the weak pull-down 325 so that the external driver does not need to source any additional current through the pull-down 325.

The external source connected to the CEN01 input pad 311 may drive waveform 392 active low at 398. The OR gate 340 propagates the waveform 392 to enable the internal chip enable line 241 as shown by waveform 396 at 399.

Figure 4A:
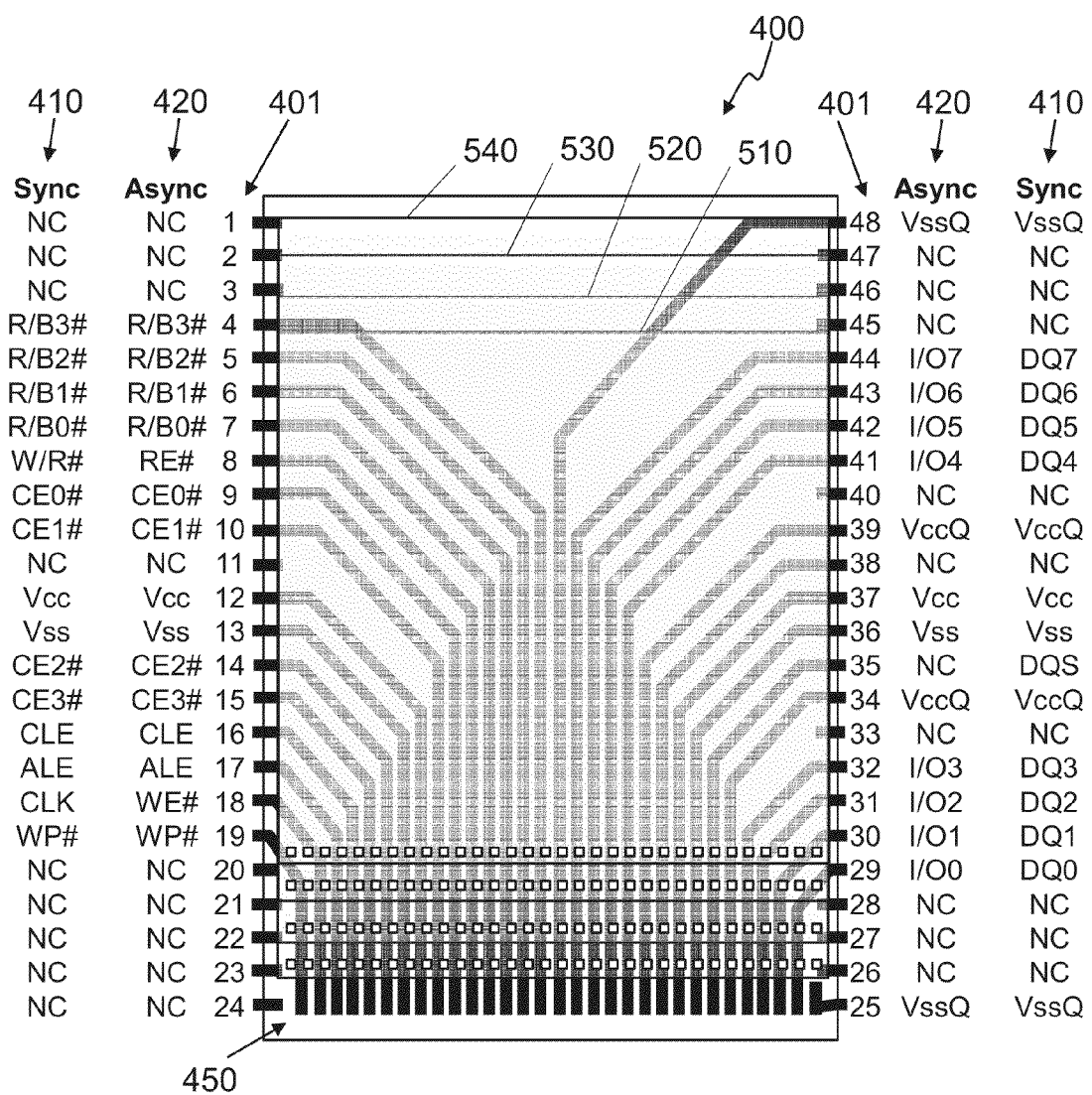
FIG. 4A shows a plan view of an embodiment of a memory device supporting four memory dice with separate chip enable inputs in a package with a lead-frame.

FIG. 4A shows a diagram of an embodiment of a memory device 400 supporting four memory dice with separate chip enable inputs. The memory device 400 of the embodiment shown may be a 48 pin thin small-outline package (TSOP) compliant with revision 2.3 of the ONFI specification published by the ONFI Workgroup which may be available from the ONFI website at www.onfi.org. Other embodiments may be compliant with other revisions of the ONFI specification, various Joint Electronic Devices Engineering Council (JEDEC) specifications, specifications from other standards bodies, or may use a proprietary pin-out. Pin numbers 401 are matched to either synchronous pin names 410 or asynchronous pin names 420.

Figure 4B:
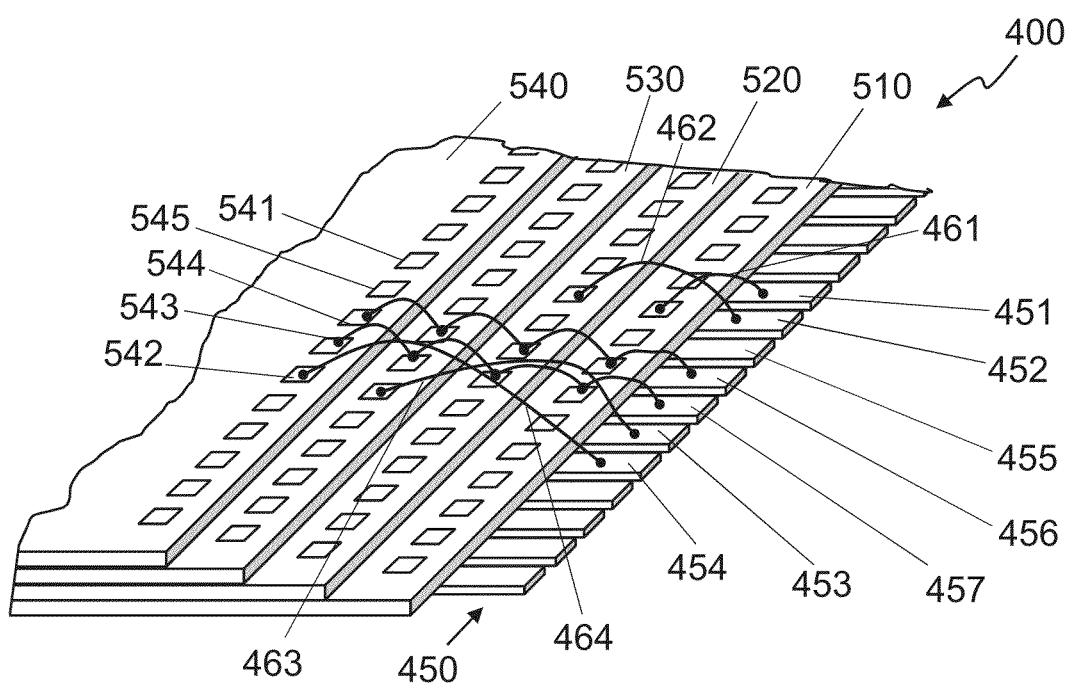
FIG. 4B is a perspective view of a portion of an embodiment showing the input/output (I/O) pads of four memory dice and their respective chip enable connections to the package lead-frame.

The embodiment shown for the memory device 400 may include a first memory die 510, a second memory die 520, a third memory die 530 and a fourth memory die 540 as shown in FIGS. 4A and 4B. The memory dice may be arranged in a shingled fashion, offsetting the dice in one or two dimensions from one another as they are stacked to expose the pads on one or two sides of the memory dice. The memory device 400 also includes wiring apparatus such as a lead-frame 450 that connects the pins to die connection points that can then be wire bonded to pads on the memory dice.

FIG. 4B shows a perspective view of a portion of input/output (I/O) pads of four memory chips and their respective chip enable connections of an embodiment. The shingled arrangement of the memory dice may be seen more clearly in this view. The first memory die 510 may be positioned on the lead-frame 450 leaving enough of the lead-frame 450 exposed to allow for wire bonds to be made to the lead-frame 450. The second memory die 520 may be placed on top of the first memory die 510 but offset away from the exposed lead-frame so that the pads of the first memory die 510 are exposed and available for wire bonding. The third memory die 530 may be placed on top of the second memory die 520 offset to expose the pads of the second memory die 520 and the fourth memory die 540 may be placed on top of the third memory die 530 offset to expose the pads of the third memory die. In some embodiments the memory dice may be offset in two dimensions to expose two edges of the dice.

Because the TSOP package of the memory device 400 has at least one pin between the two groups of chip enable pins, Vss and Vcc for the pinout shown, if the memory dice only had a single chip enable pin, some method of connecting the chip enable pins of the memory device that are on the opposite side of the Vss/Vcc pins would be used, such as a jumper in the package or crossing bond wires. Providing two separate chip enable pads on opposite sides of the Vss/Vcc pins allows the individual chip enable pins of the package to be connected to respective chip enable pads of the memory dice without using an in-package jumper or crossing bond wires. Using the self-disabling buffer circuitry as described above, does not increase the input capacitance of the chip enable pins significantly, as would occur if two pads were simply connected together to feed a single input buffer. The TSOP chip enable pins only see the capacitance of one input buffer, one pad, one bond wire, and the small capacitance of the added pull-down devices.

A CE0# die connection area 451 of the lead-frame 450 may be wire bonded to the CEN01 pad of the first memory die 510 with wire bond 461. A CE1# die connection area 452 of the lead-frame 450 may be wire bonded to the CEN01 pad of the second memory die 520 with wire bond 462. A CE2# die connection area 453 of the lead-frame 450 may be wire bonded to the CEN23 pad of the third memory die 530 with wire bond 463. A CE3# die connection area 454 of the lead-frame 450 may be wire bonded to the CEN23 pad 542 of the fourth memory die 540 with wire bond 464. Vcc die connection area 456 may be wire bonded to the Vcc pad of the first memory die 510 with daisy-chained wire bonding on to the Vcc pad of the second memory die 520, the Vcc pad of the third memory die 530 and the Vcc pad 544 of the fourth memory die 540. Vss die connection area 457 may be wire bonded to the Vss pad of the first memory die 510 with daisy-chained wire bonding on to the Vss pad of the second memory die 520, the Vss pad of the third memory die 530 and the Vss pad 543 of the fourth memory die 540. The CEN23 pad of the first memory die 510 and the second memory die 520 may not be connected to the lead-frame 450, and the CEN01 pad of the third memory die 530 and the CEN01 pad 541 of the fourth memory die 540 also may not be connected to the lead-frame 450. Other pads such as other pad 545 of the fourth memory die may or may not be connected to the lead-frame 450 such as to die connection area 455.

The memory device 400 and the memory dice 510, 520, 530, 540 may be designed so that once the memory dice are properly aligned in the memory device 400, the CEN01 pads of the memory dice are generally aligned with the CE0# die connection area 451 and CE1# die connection area 452 of the lead-frame 450 and the CEN23 pads of the memory dice are generally aligned with the CE2# die connection area 453 and the CE3# die connection area 454. With such an alignment, the various bonding wires may be attached between the lead-frame 450 and the dice without crossing.

Figure 5:
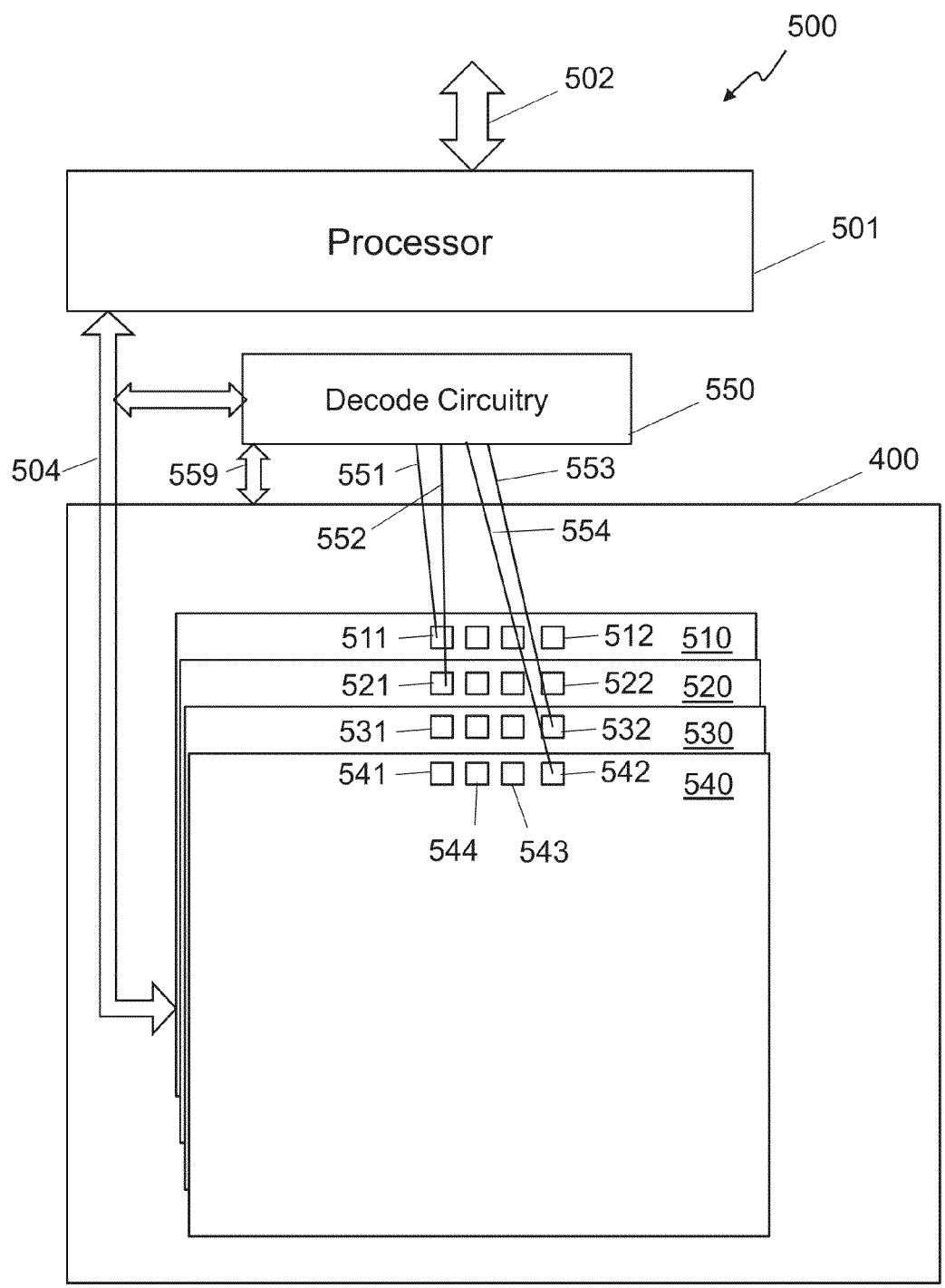
FIG. 5 is a block diagram of a system utilizing an embodiment.

FIG. 5 is a block diagram of a computing or storage system 500 utilizing an embodiment including a processor 501 coupled to a memory device 400 with control/address/data 504. The processor 501 may be an external microprocessor, microcontroller, or some other type of external controlling circuitry. In some embodiments, the processor 501 may be integrated in the same package as the memory device 400. The processor 501 may have external memory, such as random access memory (RAM) and read only memory (ROM), used for program storage and intermediate data or ii may have internal RAM or ROM. In some embodiments, the processor may use the memory device 400 for program or data storage. A program running on the processor 501 may implement many different functions including, but not limited to, an operating system, a file system, bad cell or block mapping, and error management. The block diagram of computing or storage system 500 has been simplified to focus on features of the memory that are helpful in understanding this disclosure.

In some embodiments an external connection 502 is provided. The external connection 502 is coupled to the processor 501 and allows the processor 501 to communicate to external devices. In the case of a storage system, the external connection 502 may be used to provide an external device with non-volatile storage. The external connection 502 may be used to connect to a computer or other intelligent device such as a cell phone or digital camera using a standard or proprietary communication protocol. Examples of computer communication protocols that the external connection may be compatible with include, but are not limited to, any version of the following protocols: Universal Serial Bus (USB), Serial Advanced Technology Attachment (SATA), Small Computer System Interconnect (SCSI), Fibre Channel, Parallel Advanced Technology Attachment (PATH), integrated Drive Electronics (IDE), Ethernet, IEEE-1394, Secure Digital Card interface (SD Card), Compact Flash interface, Memory Stick interface, Peripheral Component Interconnect (PCI) or PCI Express.

In some embodiments, the external connection 502 may be a network connection. The network connection may allow connectivity with network supporting an Internet protocol (IP). An IP network may be a wired network, such as ethernet, or a wireless network using radio frequency communication such as a variant of the Institute of Electrical and Electronic Engineers (IEEE) 802.11. In other embodiments the network connection may allow connectivity with a wireless telephone network utilizing various technologies including, but not limited to, code division multiple access (CDMA), global system for mobile communication (GSM), or long-term evolution (LTE). In such embodiments the processor 501 may run an operating system such as Microsoft Windows, Linux, Android, Symbian, Apple's iOS, or other operating system. The system 500 may be a battery powered portable computing platform such as, but not limited to, a smartphone, a personal digital assistant (PDA), a tablet computer, a netbook computer, a notebook computer or variations thereof.

Decode circuitry 550 may be included to partially decode the address 504 and generate various control signals 559 to the memory chip 503. The decode circuitry 550 may also generate multiple chip enable (CE) signals such as CE1 551, CE2 552, CE3 553, and CE4 554 that may also be connected to the memory device 400. In some embodiments, the decode circuitry 550 may be integrated into the processor 501.

The memory device 400 may include multiple memory dice such as die one 510, die two 520, die three 530 and die four 540. The memory dice may include power and ground or other connections such as Vcc 544 and Vss 543. A package lead-frame and boding wires, or other connections, may be used to connect signals from the package connections to the various memory dice 510, 520, 530, 540. In the example shown, CE0 551 is connected to the CE01 input 511 of die one 510 and the CE34 input 512 of die one 510 may be left unconnected. CE1 552 is connected to the CE01 input 521 of die two 520 and the CE34 input 522 of die two 520 may be left unconnected. CE2 553 is connected to the CE34 input 532 of die three 530 and the CE01 input 531 of die three 530 may be left unconnected. CE3 554 is connected to the CE34 input 542 of die four 540 and the CE01 input 541 of die four 540 may be left unconnected. The individual memory dice may include embodiments of self-disabling chip enable input circuitry connected to their respective chip enable input pads that propagate a driven chip enable input of the die even if the other chip enable input is unconnected, such as the circuitry shown in FIGS. 1A, 2A & 3A.

It is appreciated that the claimed subject matter has been explained with reference to exemplary embodiments, and that the claimed subject matter is not limited to the specific details given above. References in the specification made to other embodiments fall into the scope of the present claimed subject matter.

Any reference to device may include a component, circuit, module, or any such mechanism in which the device can achieve the purpose or description as indicated by the modifier preceding the device. However, the component, circuit, module, or any such mechanism is not necessarily a specific limitation to the device.

Reference in the specification to "an embodiment," "one embodiment," "some embodiments," or "other embodiments" means that a particular feature, structure, or characteristic described in connection with the embodiments is included in at least some embodiments, but not necessarily all embodiments, of the claimed subject matter. The various appearances of "an embodiment," "one embodiment," or "some embodiments" are not necessarily all referring to the same embodiments.

If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element. As used herein, the term "coupled" includes direct and indirect connections. Moreover, where first and second devices are coupled, intervening devices including active devices may be located there between.

Those skilled in the art having the benefit of this disclosure will appreciate that many other variations from the foregoing description and drawings may be made within the scope of the present claimed subject matter. Indeed, the claimed subject matter is not limited to the details described above, and it will be apparent that various changes may be made in the form, construction and/or arrangement of the components thereof without departing from the scope and/or spirit of the claimed subject matter or without sacrificing all of its material advantages, the form herein before described being merely an explanatory embodiment thereof, and/or further without providing substantial change thereto. It is the intention of the claims to encompass and/or include such changes.

What is claimed is:

1. An integrated circuit package, comprising:
   a first die comprising at least one power pad disposed between a first chip-enable pad and a second chip-enable pad, wherein the first chip-enable pad is bonded to an external pin of the package, and the second chip-enable pad is not connected to an external pin of the package and is left floating; and
   a first chip-enable input buffer circuit coupled to the first chip-enable pad and a second chip-enable input buffer circuit coupled to the second chip-enable pad, wherein the first chip-enable input buffer circuit is configured to be enabled at power-up of the integrated circuit package and the second chip-enable input buffer circuit is configured to be disabled at power-up of the integrated circuit package;
   a first latch to be cleared before the integrated circuit package is powered up and to be set when the first chip enable pad is driven to a predetermined logic level by an external source;
   a first weak driver to hold the first chip enable input pad at an inverse of the predetermined logic level when the first latch is clear;
   a second latch to be cleared before the integrated circuit package is powered up and to be set if the second chip enable input pad is driven to the predetermined logic level by the external source; and
   a second weak driver to hold the second chip enable input pad at the inverse of the predetermined logic level when the second latch is clear;
   logic to enable an electronic memory on the integrated circuit package only if the first chip enable input pad is at the inverse of the predetermined logic level and the second chip enable input pad is active.

2. The integrated circuit package of claim 1, wherein the first chip-enable pad is not coupled with the second chip-enable pad via a jumper.

3. The integrated circuit package of claim 1, further comprising one or more additional dies comprising one or more additional chip-enable pads and one or more additional chip-enable input buffer circuits, wherein the one or more additional chip-enable pads are not connected to an external pin of the package and are left floating, and wherein the one or more additional chip-enable input buffer circuits are configured to be disabled at power-up.

4. A multi-die integrated circuit package, comprising:
   two or more dies comprising a first chip-enable pad and a second chip-enable pad and having at least one power pad disposed therebetween;
   wherein at least one of the first chip-enable pad and the second chip-enable pad is left floating and not connected to an external chip-enable pin and coupled to a chip-enable input buffer configured to be disabled at power-up;
   a first latch to be cleared before the integrated circuit package is powered up and to be set when the first chip enable pad is driven to a predetermined logic level by an external source;
   a first weak driver to hold the first chip enable input pad at an inverse of the predetermined logic level when the first latch is clear;
   a second latch to be cleared before the integrated circuit package is powered up and to be set if the second chip enable input pad is driven to the predetermined logic level by the external source; and
   a second weak driver to hold the second chip enable input pad at the inverse of the predetermined logic level when the second latch is clear;
   logic to enable an electronic memory on the integrated circuit package only if the first chip enable input pad is at the inverse of the predetermined logic level and the second input chip-enable pad is active.

5. The multi-die integrated circuit package as claimed in claim 4, wherein chip-enable pads that are left floating are not coupled to an external chip-enable pin.

6. The multi-die integrated circuit package as claimed in claim 5, wherein chip-enable input buffers that are configured to be disabled at power-up are configured to be automatically self-disabling.

* * * * *